US009698336B2

(12) United States Patent
Kim et al.

(10) Patent No.: US 9,698,336 B2
(45) Date of Patent: Jul. 4, 2017

(54) ZINC OXIDE-CELLULOSE NANOCOMPOSITE AND PREPARATION METHOD THEREOF

(71) Applicant: INHA-INDUSTRY PARTNERSHIP INSTITUTE, Incheon (KR)

(72) Inventors: Jae Hwan Kim, Incheon (KR); Hyun U Ko, Jeju-do (KR)

(73) Assignee: INHA-INDUSTRY PARTNERSHIP INSTITUTE, Incheon (KR)

( * ) Notice: Subject to any disclaimer, the term of this patent is extended or adjusted under 35 U.S.C. 154(b) by 227 days.

(21) Appl. No.: 14/351,351

(22) PCT Filed: Oct. 26, 2012

(86) PCT No.: PCT/KR2012/008846
§ 371 (c)(1),
(2) Date: Apr. 11, 2014

(87) PCT Pub. No.: WO2013/062346
PCT Pub. Date: May 2, 2013

(65) Prior Publication Data
US 2014/0272397 A1   Sep. 18, 2014

(30) Foreign Application Priority Data

Oct. 26, 2011  (KR) .......................... 10-2011-0109717
Oct. 25, 2012  (KR) .......................... 10-2012-0119105

(51) Int. Cl.
*H01L 41/37*  (2013.01)
*H01L 41/18*  (2006.01)
(Continued)

(52) U.S. Cl.
CPC .............. *H01L 41/183* (2013.01); *C08J 5/18* (2013.01); *C08K 3/22* (2013.01); *C08K 7/16* (2013.01);
(Continued)

(58) Field of Classification Search
CPC ...... D21H 17/63; D21H 17/67–17/675; D21H 17/70; H01L 41/08–41/18; H01L 41/37; C08J 2301/02; C08K 31/22
See application file for complete search history.

(56) References Cited

FOREIGN PATENT DOCUMENTS

| JP | 2005-213376 | 8/2005 |
| KR | 10-2009-0087280 | 8/2009 |
| KR | 10-2011-0120250 | 11/2011 |

OTHER PUBLICATIONS

John et al., Preparation of cellulose-ZnO hybrid films by a wet chemical method and their characterization, Feb. 26, 2011, Cellulose (2011) 18:675-680.*
(Continued)

*Primary Examiner* — Elizabeth A Robinson
(74) *Attorney, Agent, or Firm* — Nixon & Vanderhye P.C.

(57) ABSTRACT

The present invention relates to a zinc oxide-cellulose nanocomposite made of cellulose and zinc oxide nanoparticles and to a preparation method thereof. The nanocomposite of the present invention is prepared by producing zinc oxide nanoparticles as seeds on the surface and/or inside of a cellulose film and growing the seeds into zinc oxide crystals to form a zinc oxide layer strongly attached to the cellulose film. The nanocomposite of the present invention has significantly improved piezoelectricity compared to simple cellulose piezoelectric paper and may be used for LEDs and photovoltaic power generation devices thanks to zinc oxide doped therein.

1 Claim, 5 Drawing Sheets

(51) Int. Cl.
  *C08J 5/18* (2006.01)
  *C30B 7/14* (2006.01)
  *C30B 29/16* (2006.01)
  *C08K 7/16* (2006.01)
  *C08K 3/22* (2006.01)

(52) U.S. Cl.
  CPC ............... *C30B 7/14* (2013.01); *C30B 29/16* (2013.01); *H01L 41/37* (2013.01); *C08J 2301/02* (2013.01); *C08K 2003/2296* (2013.01); *Y10T 428/265* (2015.01); *Y10T 428/31993* (2015.04)

(56) References Cited

OTHER PUBLICATIONS

Gonçallves et al., Growth, Structural, and Optical Characterization of ZnO-Coated Cellulosic Fibers, Dec. 4, 2008, Crystal Growth & Design, vol. 9, No. 1, American Chemical Society, pp. 386-390.*
International Search Report for PCT/KR2012/008846 mailed Feb. 13, 2013.
H. Gullapalli et al., "Flexible Piezoelectric ZnO-Paper Nanocomposite Strain Sensor", small 2010, vol. 6, pp. 1641-1646, Jul. 7, 2010.
K. Ghule et al., "Preparation and Characterization of ZnO Nanoparticles Coated Paper and its Antibacterial Activity Study", Green Chem. 2006, vol. 8, pp. 1034-1041, Sep. 15, 2006.

* cited by examiner

ZINC OXIDE-CELLULOSE NANOCOMPOSITE AND PREPARATION METHOD THEREOF

This application is the U.S. national phase of International Application No. PCT/KR2012/008846 filed 26 Oct. 2012 which designated the U.S. and claims priority to KR 10-2011-0109717 filed 26 Oct. 2011, and KR 10-2012-0119105 filed 25 Oct. 2012, the entire contents of each of which are hereby incorporated by reference.

TECHNICAL FIELD

The present invention relates to a zinc oxide (ZnO)-cellulose nanocomposite and a method of preparing thereof. More particularly, the present invention relates to a method of preparing a zinc oxide-cellulose nanocomposite by producing zinc oxide seeds on the surface and/or inside of a cellulose film.

BACKGROUND ART

Since the piezoelectric effect (piezoelectricity) was discovered in quartz crystals about 100 years ago by Jacques and Pierre Curie, it has been used in various fields, including medical, military, household electric appliance, and exploration fields. Particularly, since a piezoelectric ceramic material was developed around World War II, technologies that use the same have been widely developed, including accelerometer sensors, IR sensors, ultrasonic transducers, speakers, microphones, actuators, sonars, and the like.

The piezoelectric effects are classified into direct piezoelectric effect and converse piezoelectric effect. The term "direct piezoelectric effect" refers to the internale generation of electrical charge when aa mechanical force is applied to a piezoelectric material, and conversely, the term "converse piezoelectric effect" refers to the internal generation of a mechanical strain when an electrical field is applied to a piezoelectric material. Examples of application of the direct piezoelectric effect include microphones, vibration sensors, accelerometer sensors and the like, and examples of application of the converse piezoelectric effect include speakers, actuators and the like.

Piezoelectric materials have pyroelectricity that is a phenomenon in which a voltage is generated on the surface of the piezoelectric material when the temperature around the piezoelectric material changes. Such materials having pyroelectricity include piezoelectric ceramics and piezoelectric polymers.

Piezoelectric ceramics have been studied since a piezoelectric ceramic material consisting of barium-titanium oxide ($BaTiO_3$) was developed in 1940s and a piezoelectric ceramic material consisting of an oxide of lead-zirconate-titanate (PZT) was developed in 1950s. The piezoelectric ceramics have a hard and dense structure, and thus have advantages in that they are chemically inactive, have tolerance to moisture or temperature variations, and are accurately aligned by mechanical or electrical means. However, these piezoelectric ceramics are disadvantageously brittle, heavy in weight, and inflexible. Particularly, lead contained in the piezoelectric ceramics is harmful to the human body, and thus studies on new piezoelectric ceramics containing no lead have been conducted.

Piezoelectric polymers have been developed since the piezoelectricity of polyvinylidene fluoride (PVDF) was discovered in 1969 by Kawai. Piezoelectric polymers are thin engineering plastics that are easily processed compared to other sensor materials. In addition, these polymers are easily processed in large areas, have flexibility and high impact resistance, are not brittle, are light in weight, and show good sound properties for ultrasonic applications, and good productivity. However, these polymers have disadvantages in that they are used in a limited temperature range and are not suitable for measurement of DC current and the piezoelectric properties thereof are lower than those of piezoelectric ceramics.

Recently, a piezoelectric paper prepared by aligning regenerated cellulose was reported. The piezoelectric paper has piezoelectricity similar to that of existing piezoelectric polymers, and cellulose is biodegradable and biocompatible, and thus does not cause environmental pollution. Due to these advantages, the cellulose piezoelectric paper can be used in the biomedical engineering field related to the human body. In addition, the cellulose piezoelectric paper has excellent heat resistance so as to be capable of resisting high temperatures compared to existing piezoelectric polymers, and thus can be used as a new piezoelectric material. With respect to the cellulose piezoelectric paper, Korean Patent Laid-Open Publication No. 2009-0087280 discloses a piezoelectric paper and a preparation method thereof, the method comprising the steps of: adding sodium hydroxide, DMAc (N,N-dimethylacetamide) or NMMO (N-methyl-morpholine-N-oxide) as a solvent to bulk cellulose to make a cellulose solution; subjecting the solution to a spin-coating or casting process to form a thin film comprising cellulose fibers aligned in a specific direction; washing the formed thin film with water to remove the remaining solvent; and disposing an electrode on the formed cellulose thin film.

According to the above document, cellulose paper is bulky paper composed of entangled fibers, and cellulose pulp is dissolved in a solvent such as sodium hydroxide, DMAc or NMMO to make a cellulose solution. Then, when the cellulose solution is spin-coated, the fibers are aligned by the centrifugal force, and when the cellulose solution is extruded, the fibers are aligned in the extrusion direction by mechanical effects such as applied tensile stress. The prepared cellulose film is washed with water to remove the solvent, thereby preparing cellulose paper composed of regenerated paper. When the cellulose paper is mechanically stretched, the cellulose fibers are aligned in the machined direction.

However, the piezoelectric paper prepared as described above has disadvantages in that it has low piezoelectricity and is sensitive to moisture. In addition, piezoelectric polymers or electroactive polymers (EAPs) have advantages in that they are flexible and show a fast response speed and a relatively high displacement, but disadvantages in that they have low piezoelectric properties, require high operating voltages, are prepared at high costs, and particularly cause industrial waste due to lack of biodegradability.

To overcome such disadvantages, the present inventors attempted to use the piezoelectricity of zinc oxide (ZnO) in cellulose. Zinc oxide (ZnO) is a semiconductor material having a wide band gap (3.37 eV) and high electron-hole binding energy (60 meV) and is used in electronic, optical, laser and LED devices, etc. Particularly, zinc oxide having high piezoelectricity can be used in sensors, signal transformers and the like. In addition, zinc oxide is biocompatible and biodegradable, and thus can be used in human- and environment-friendly biomedical engineering systems and green energy production systems. However, a film made of zinc oxide is brittle, and thus much care is required in making products using this film. A zinc oxide film can be fabricated by a sol-gel method or a metal-oxide chemical vapor deposition (MOCVD) method, but it is difficult to fabricate a zinc oxide film on a flexible piezoelectric paper such as cellulose by these methods.

With respect to the application of a zinc oxide film to a cellulose film, the present inventors filed Korean Patent Application No. 2010-0039564, entitled "Cellulose-ZnO piezoelectric paper and preparation method thereof". According to the document, a cellulose-zinc oxide piezoelectric paper is prepared by adding a wet cellulose film to a solution of zinc nitrate and triethanolamine, reacting the solution with the cellulose film to produce and grow zinc oxide (ZnO) particles on the surface and/or inside of the cellulose film to thereby form a cellulose-zinc oxide composite film, stretching the cellulose-zinc oxide composite film at a predetermined ratio, and drying the stretched cellulose-zinc oxide composite film using a near infrared lamp. However, the cellulose-zinc oxide piezoelectric paper prepared by this method has the disadvantage of low piezoelectric performance, because zinc oxide particles do not strongly adhere to the surface of the cellulose film.

DISCLOSURE

Technical Problem

Accordingly, the present invention has been made in order to solve the above-described problems occurring in the prior art, and an object of the present invention is to provide a zinc oxide-cellulose nanocomposite, which has excellent piezoelectricity, is flexible and can be used as a photovoltaic power generation material and an LED material, and a preparation method thereof.

Technical Solution

In order to accomplish the above object, in one aspect, the present invention provides a zinc oxide-cellulose nanocomposite having piezoelectricity, biodegradability and biocompatibility, which is prepared by producing zinc oxide nanoparticles as seeds on the surface and/or inside of a cellulose film and growing the seeds into zinc oxide crystals to form a dense zinc oxide layer strongly attached to the cellulose film.

Specifically, the present invention provides a cellulose-zinc oxide nanocomposite having a dense zinc oxide layer formed by producing zinc oxide nanoparticles as seeds on the surface and/or inside of a cellulose film and growing the seeds into zinc oxide crystals.

Preferably, the zinc oxide layer is present in an amount of 5-40 wt % based on the total weight of the nanocomposite.

Preferably, the zinc oxide layer has a thickness of 100-1000 nm.

In another aspect, the present invention provides a method for preparing a zinc oxide-cellulose nanocomposite, the method comprising the steps of: preparing a cellulose film; producing zinc oxide seeds on the surface and/or inside of the cellulose film; and forming a zinc oxide layer on the cellulose film by growing zinc oxide crystals from the zinc oxide seeds.

Preferably, the step of producing the zinc oxide seeds comprises adding the cellulose film to an aqueous solution containing a zinc source and an amine group-containing compound, followed by stirring at a temperature between 50° C. and 90° C. for 1-12 hours.

Preferably, the step of producing the zinc oxide seeds comprises applying a mixture of a zinc source and a solvent 1-10 times to the cellulose film, followed by reaction at a temperature between 70° C. and 150° C. for 10 minutes to 2 hours.

In another aspect, the present invention provides a method for preparing a cellulose-zinc oxide nanocomposite, the method comprising the steps of: mixing an organic solvent with a surfactant at a weight ratio of 1:3-1:10 and adding zinc oxide nanoparticles thereto to prepare a mixed solution; adding a cellulose solution to the mixed solution, followed by stirring; subjecting the stirred solution to a casting process and a washing process to prepare a cellulose film having zinc oxide seeds produced thereon and/or therein; and forming a zinc oxide layer on the cellulose film by growing zinc oxide crystals from the zinc oxide seeds.

Preferably, the step of forming the zinc oxide layer comprises adding the cellulose film having the zinc oxide seeds produced thereon and/or therein to an aqueous solution containing a zinc source and an amine group-containing compound, followed by stirring at a temperature of 60~90° C. for 2-10 hours.

Advantageous Effects

According to the present invention, the cellulose-zinc oxide nanocomposite made of cellulose and zinc oxide nanoparticles has maximized piezoelectricity while showing significantly mechanical properties and piezoelectric properties compared to the piezoelectric paper. In other words, the cellulose-zinc oxide nanocomposite has excellent piezoelectricity and flexibility, because it has a crystalline structure formed by aligning cellulose fibers and zinc oxide nanoparticles in a specific direction and the amorphous region of the cellulose has the ability to hold charge.

Moreover, the cellulose-zinc oxide nanocomposite according to the present invention is light in weight and highly flexible while having high mechanical strength and modulus compared to general polymers, and thus can exhibit high strain and elasticity. In addition, it has high piezoelectricity, and thus shows a high strain even at a low voltage and requires low power consumption. Furthermore, the cellulose-zinc oxide nanocomposite having piezoelectricity is biodegradable and biocompatible, and thus does not cause environmental pollution and is harmless to the human body.

Further, the method for preparing the nanocomposite according to the present invention is very simple while enabling nanoparticles to be fixed to the cellulose film without using a binder, a dendritic side group or a high-temperature process such as calcination.

The piezoelectric nanocomposite according to the present invention and the preparation method thereof enable high-performance piezoelectric paper to be prepared using biodegradable and biocompatible cellulose and zinc oxide nanoparticles, and thus speakers, microphones, sensors, switches, RFID tags, ID cards and other products can be produced in a cost-effective manner using the lightweight piezoelectric nanocomposite of the present invention.

Accordingly, the nanocomposite according to the present invention and the preparation method thereof are applicable in all the fields in which piezoelectric materials are used, and make it possible to find new markets, including cards. Thus, the nanocomposite of the present invention is applicable in a wide range of markets.

DESCRIPTION OF DRAWINGS

FIG. 2 is a set of scanning electron microscope (SEM) images showing the surface (a) and cross section (b) of a zinc oxide-cellulose nanocomposite prepared by producing zinc oxide seeds using a pre-coating method.

FIG. 3 is a set of scanning electron microscope (SEM) images showing the surface (a) and cross section (b) of a zinc oxide-cellulose nanocomposite prepared by producing zinc oxide seeds using a blending method.

BEST MODE

The present invention relates to a zinc oxide-cellulose nanocomposite made of cellulose and zinc oxide nanoparticles and to a preparation method thereof. The nanocomposite according to the present invention has excellent piezoelectricity, biodegradability and biocompatibility, which is prepared by producing zinc oxide nanoparticles as seeds on the surface and/or inside of a cellulose film and further growing the zinc oxide nanoparticles to form a zinc oxide layer strongly attached to the surface of the cellulose film.

If the zinc oxide layer is present in an amount of less than 5 wt % based on the total weight of the composite, an increase in the piezoelectric effect will be insignificant, and if the zinc oxide layer is present in an amount of more than 40 wt % based on the total weight of the composite, it will be highly brittle. For this reason, the zinc oxide nanoparticles are preferably present in an amount of 5-40 wt % based on the total weight of the composite. More preferably, the zinc oxide nanoparticles are contained in an amount of 10-20 wt %.

Moreover, the zinc oxide nanoparticles preferably have a particle size of 50-400 nm, and more preferably 100-300 nm. If the particle size is less than 50 nm, an area that exhibits the piezoelectric effect will be small, and thus the composite will have an insufficient piezoelectric effect, and if the particle size is more than 400 nm, there will be a problem in that the nanoparticles aggregate. In addition, the zinc oxide nanoparticles grow into rod-like zinc oxide crystals that form a zinc oxide layer. The zinc oxide layer preferably has a thickness of 100-1000 nm.

The zinc oxide-cellulose nanocomposite according to the present invention can overcome the disadvantage of highly brittle zinc oxide, because it comprises zinc oxide nanoparticles not only the surface, but also inside of the cellulose film.

The cellulose-zinc oxide nanocomposite according to the present invention has a piezoelectric constant ($d_{31}$) between 30 pC/N and 500 pC/N.

The cellulose-zinc oxide nanocomposite according to the present invention has a Young's modulus of 2-6 GPa.

The cellulose-zinc oxide nanocomposite according to the present invention is prepared by a method comprising the steps of: (S11) preparing a cellulose film; (S12) producing zinc oxide seeds on the surface and/or inside of the cellulose film; and (S13) growing zinc oxide crystals from the produced zinc oxide seeds to form a zinc oxide layer on the cellulose film.

Step (S11) of preparing the cellulose film may be performed by any conventional method known in the art. For example, the cellulose film can be prepared by dissolving cellulose pulp to make a cellulose solution, and spin-coating the cellulose solution or casting the cellulose solution using a doctor blade. Specifically, sodium hydroxide, DMAc (N,N-dimethylacetamide) or NMMO (N-methylmorpholine-N-oxide) as a solvent is added to bulk cellulose to make a cellulose solution. The cellulose solution may be subjected to a spin-coating, extrusion or casting process to obtain a cellulose film.

Next, zinc oxide seeds are produced on the surface and/or inside of the cellulose film (step S12). This step can be performed by a method selected from the group consisting of a pre-coating method, a blending method and a direct application method.

In the pre-coating method, an aqueous solution containing a zinc source and an amine group-containing compound is prepared. Then, the cellulose film is added to the solution and stirred at a temperature of 40° C. to 90° C. for 1-12 hours to produce zinc oxide seeds on the surface and/or inside of the cellulose film. More preferably, the mixture of the cellulose film and the solution is stirred at a temperature between 50° C. and 80° C. for 3-10 hours to produce zinc oxide seeds.

The zinc source that is used to produce the seeds is selected from the group consisting of zinc nitrate hexahydrate, zinc nitrate monohydrate, zinc citrate, zinc acetate, zinc acetate dihydrate, zinc bromide, anhydrous zinc bromide, zinc chloride, zinc fluoride, zinc iodide, and mixtures thereof. However, the zinc source is not limited thereto, and any compound may be used without limitation in the present invention, as long as it can provide zinc.

Preferably, the zinc source is used in an amount of 0.01-5 wt %, and preferably 0.1-3 wt %, based on the total weight of the aqueous solution.

The amine group-containing compound that is used in the present invention is preferably selected from the group consisting of triethanolamine, triethylamine, hexamethylenetetramine, ammonia, ammonium hydroxide, sodium hydroxide, potassium hydroxide, ethanolamine, and mixtures thereof. However, the amine group-containing compound is not limited thereto, and any compound containing an amine group may be used without limitation in the present invention.

The amine group-containing compound is preferably used in an amount of 0.01-5 wt %, and more preferably 0.1-3 wt %, based on the total weight of the aqueous solution.

Figure 1:
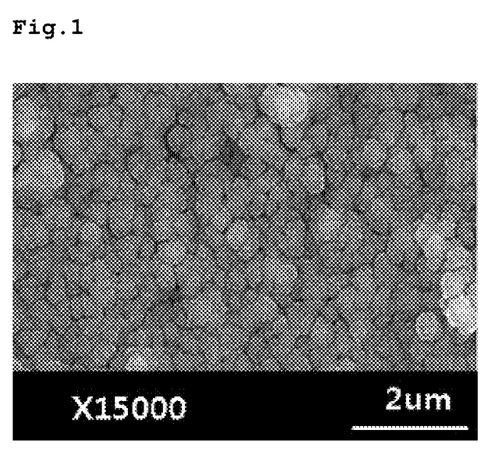
FIG. 1 is a scanning electron microscope (SEM) image showing the morphology of the surface of a cellulose film having zinc oxide seeds produced thereon by a pre-coating method according to an example of the present invention.
Figure 2A:
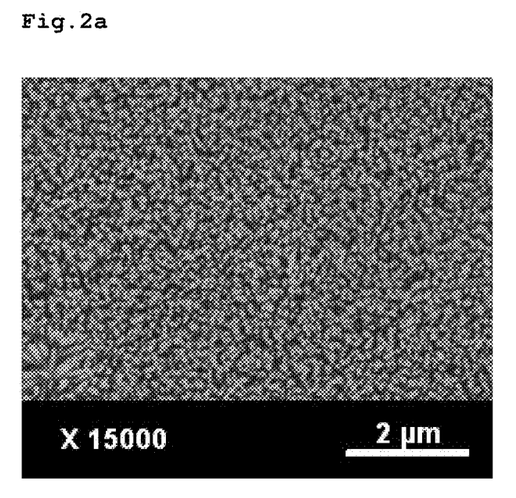
Figure 2B:
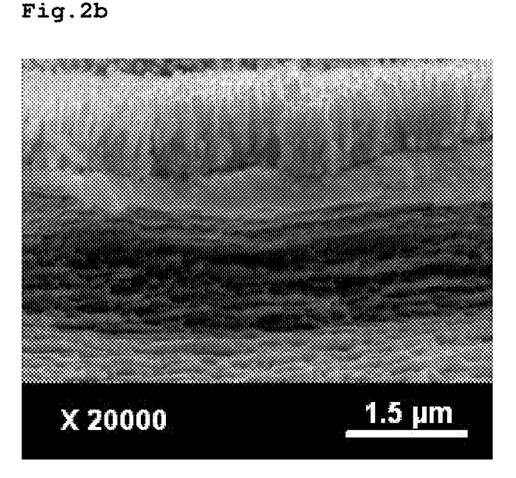
Figure 3A:
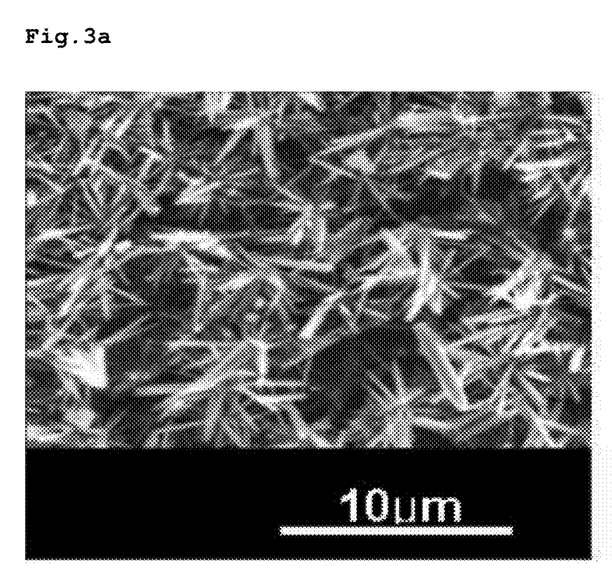
Figure 3B:
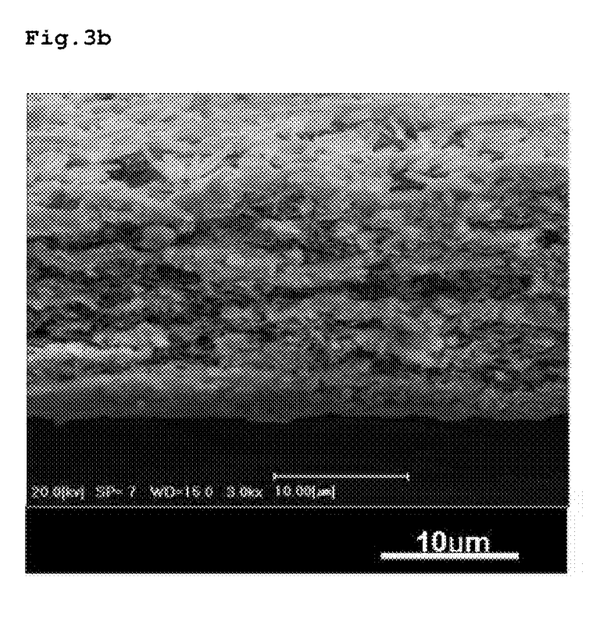

FIG. 1 shows a SEM image showing the surface of a cellulose film having zinc oxide seeds produced thereon by the above-described pre-coating method.

Another method is a method of producing zinc oxide seeds by blending. In this method, an organic solvent and a surfactant are mixed with each other, followed by ultrasonic stirring for 1-3 hours. The weight ratio of the organic solvent to the surfactant may preferably be 1:3 to 1:10, and more preferably 1:5 to 1:7. The organic solvent that is used herein may be dimethylacetamide (DMAc), acetone, cyclohexanone, 1-methyl-2-pyrrolidinone (NMP) or the like, and the surfactant may be sodium dodecyl sulfate (SDS), linear sodium alkyl benzene sulfonate (LAS), alcohol ethoxylate (AE) or the like. Next, 100 mg of zinc oxide nanoparticles are added to the mixed solution, followed by ultrasonic stirring for 1-3 hours. To the resulting zinc oxide/DMAc solution, 15 ml of a cellulose solution is added, and the mixture is stirred at a temperature of 50° C. to 80° C. for 1-5 hours to obtain a blend solution of cellulose/zinc oxide/DMAc. More preferably, the stirring is performed at a temperature of 60° C. to 80° C. for 2-4 hours. The blend solution is subjected to a casting process and a washing process to produce zinc oxide seeds on the surface and inside of the cellulose film.

Still another method is a method of producing zinc oxide seeds by direct application. In this method, a zinc source and a solvent are mixed with each other to make a mixed solution, which is then applied to a dry cellulose film to produce seeds. Methods for applying the mixed solution to the cellulose film include a drop method of dropping the mixed solution using a spoid, a blade method of uniformly dispersing the dropped mixed solution using a glass or doctor blade having a sharp edge, and a spin coating method of applying the mixed solution using a spin coater. Application of the mixed solution is repeated 1-10 times, and the cellulose film having the solution applied thereto is maintained at a temperature of 70° C. to 150° C., thereby producing zinc oxide seeds on the surface of the cellulose film. Preferably, the temperature at which the cellulose film is maintained is 80° C. to 130° C. After the seeds are formed, the cellulose film is maintained at the same temperature for 10 minutes to 2 hours to volatilize the remaining solvent.

The zinc source that is used to form seeds in this blending method may be the same as that used in the pre-coating method. Preferably, the zinc source may be selected from the group consisting of zinc nitrate hexahydrate, zinc nitrate monohydrate, zinc citrate, zinc acetate, zinc acetate dihydrate, zinc bromide, anhydrous zinc bromide, zinc chloride, zinc fluoride, zinc iodide, and mixtures thereof. However, the zinc source is not limited thereto, and any compound may be used without limitation in the present invention, as long as it can provide zinc.

Preferably, the zinc source is used in an amount of 0.05-10 wt %, and preferably 0.5-7 wt %, based on the total weight of the solvent.

The solvent is preferably selected from among ethanol, methanol and a solution having an alkyl group ($C_nH_{2n+1}$). However, the solvent is not limited thereto, and any solvent may be used without limitation, as long as it can react with the zinc source to produce a hydroxyl group (OH).

Figure 5:
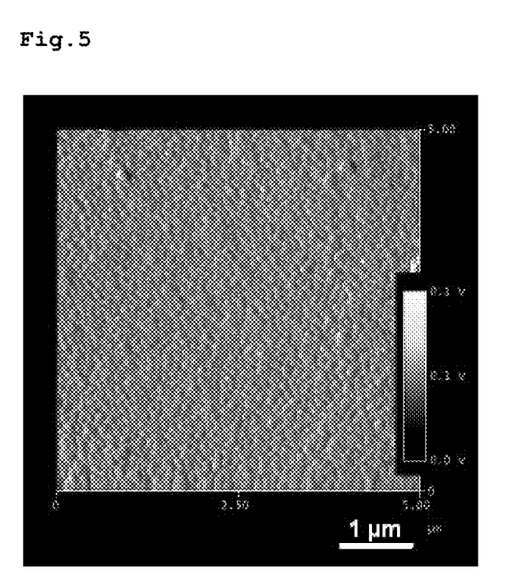
FIG. 5 is an atomic force microscope (AFM) image showing the surface morphology, the uniformity of dispersion of seeds and the size of seeds on the surface of a cellulose film having zinc oxide seeds produced by a direct application method according to an example of the present invention.

FIG. 5 shows an AFM image of the surface of a cellulose film having zinc oxide seeds produced thereon by the above-described direct application method.

Finally, step (S13) is a step of growing zinc oxide crystals from the zinc oxide seeds produced on the cellulose film, thereby forming a zinc oxide layer on the cellulose film.

In this step, the cellulose film having the zinc oxide seeds produced therein and/or thereon is added to an aqueous solution containing a zinc source and an amine group-containing compound. Then, the aqueous solution is stirred at a temperature of 60° C. to 90° C. for 2-10 hours to grow zinc oxide crystals from the zinc oxide seeds on the surface of the cellulose film, thereby forming a zinc oxide layer on the cellulose film.

Each of the zinc source and the amine group-containing compound is preferably used in an amount of 0.01-5 wt % based on the total weight of the aqueous solution.

In the above-described method for preparing the cellulose-zinc oxide nanoparticle composite, the formation and growth of zinc oxide crystals occur as follows.

The amine group-containing compound reacts with the zinc source to form a zinc-amine complex. Then, as the reaction temperature is increased, zinc hydroxide is formed. The formed zinc hydroxide is formed into very small zinc oxide particles on the surface or inside of the cellulose film, and the zinc oxide particles function as seeds. Such small particles aggregate to form nanosized zinc oxide. When a base such as sodium hydroxide or potassium hydroxide is used, it reacts with the zinc source to form zinc oxide, which is then formed into nanoparticles by hydrolysis as the reaction temperature is increased. The particle size of the formed zinc oxide is determined by the reaction temperature and time, the zinc concentration, pH acidity, etc. When the base is used, zinc hydroxide is directly formed by the reaction between the base and the zinc source, and then formed into nanoparticles as the reaction temperature is increased.

The formation of zinc oxide nanorods from zinc oxide seeds by hydrothermal synthesis is influenced by additional chemicals such as organic ligands, metal ion impurities, pH acidity and the like (see Nature Materials, 10(9), p 596-601, August 2011). The Formation of zinc oxide nanorods is influenced predominantly by face-selective electrostatic interaction (see Crystal Growth and Design, 9, p 2570-2575, 2009). The growth of zinc oxide nanorods can be achieved by adding an amine group to the zinc oxide source to control the local reaction environment during growth. The amine group results in production of a complex, which has a charge but is not reactive, and the complex causes a portion having the opposite charge to be formed on the surface of zinc oxide so as to control the attachment of highly reactive zinc to the surface of crystals, thereby facilitating the growth of nanorod crystals.

The zinc oxide nanoparticles have a particle size of 50-400 nm, and the zinc oxide layer composed of the grown zinc oxide nanorod crystals has a thickness of 100-1000 nm. Moreover, the zinc oxide layer is present in an amount of 10-70 wt % based on the total weight of the nanocomposite. In addition, the nanocomposite prepared according to the present invention has a piezoelectric constant ($d_{31}$) between 30 pC/N and 500 pC/N.

Figure 4:
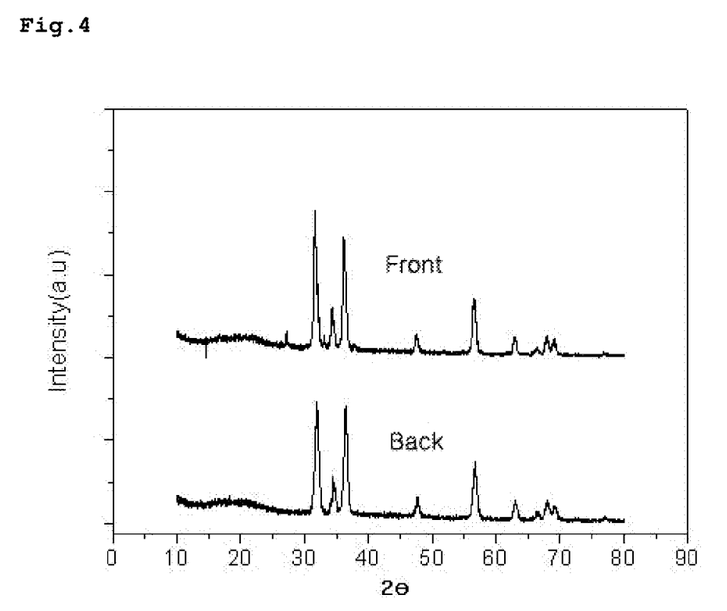
FIG. 4 shows the results of X-ray diffraction analysis of a zinc oxide-cellulose nanocomposite prepared by producing zinc oxide seeds using a pre-coating method according to an example of the present invention.

FIG. 4 shows the results of X-ray diffraction analysis of the cellulose-zinc oxide nanocomposite prepared by producing zinc oxide seeds using the pre-coating method. As can be seen in FIG. 4, the diffraction pattern of the zinc oxide is almost identical between the front side and the back side and shows peaks at 31.7°, 34.4°, 36.4°, 47.5°, 56.5°, 62.8°, 67.9°, and 69.1°. This suggests that the zinc oxide had the wurtzite crystal structure and was well formed on the cellulose film.

Figure 6:
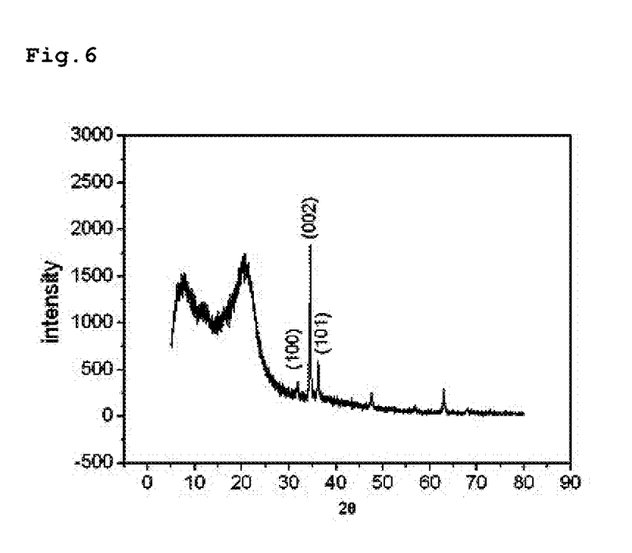
FIG. 6 shows the results of X-ray diffraction analysis of a zinc oxide-cellulose nanocomposite prepared by producing zinc oxide seeds using a pre-coating method.

FIG. 6 shows the results of X-ray diffraction analysis of the cellulose-zinc oxide nanocomposite prepared by producing zinc oxide seeds using the pre-coating method. As can be seen therein, the diffraction pattern of the zinc oxide shows peaks at 31.7°, 34.4° and 36.4°. This suggests that the zinc oxide had the wurtzite crystal structure and was well formed on the cellulose film. Particularly, the (002) crystal plane peak at 34.4° indicates that most of the zinc oxide grew in a direction perpendicular to the surface of the cellulose film.

Hereinafter, the present invention will be described in further detail with reference to examples. It is to be understood, however, that these examples are for illustrative purposes only and are not intended to limit the scope of the present invention as defined in the accompanying claims.

MODE FOR INVENTION

Examples

Preparation Example: Preparation of Cellulose Film

The bulk cellulose, cotton pulp having a polymerization degree of 4,500 was cut into small pieces. Each of the cotton pulp and lithium chloride was dried in an oven at 100° C. to evaporate water. The cotton pulp was mixed with lithium chloride and anhydrous DMAc such that the weight ratio of pulp: lithium chloride: anhydrous DMAc was 1:8:90. The mixture was heated with stirring at 135° C. to dissolve the cellulose in the solvent. The wet cellulose film was cast onto a glass substrate using a doctor blade and treated with a 50:50 (v/v) mixture of isopropyl alcohol and deionized water, thereby obtaining a free-standing regenerated wet cellulose film.

Example 1: Production of Zinc Oxide Seeds by Pre-Coating, and Preparation of Zinc-Oxide Nanocomposite 0.005 mole of zinc nitrate hexahydrate and 0.005 mole of triethanolamine were dissolved in 500 ml of deionized water. The regenerated wet cellulose film (80×80 mm) prepared in the Preparation Example above was added to and stirred in the solution at 60° C. for 6 hours to produce zinc oxide seeds on the surface and/or inside of the cellulose film.

Next, the cellulose film having the produced seeds was washed with distilled water to remove unbound zinc oxide particles. The washed cellulose film was added to and reacted with an aqueous solution of 0.03 mole of zinc sulfate and 0.9 mole of ammonium chloride at 60° C. for 6 hours to grow rod-like zinc oxide crystals, thereby forming a zinc oxide layer having a thickness of about 5 μm. The piezoelectric constant and Young's modulus of the zinc oxide-cellulose nanocomposite prepared as described above were measured to be 112 pC/N and 2.3 GPa, respectively.

Examples 2: Production of Zinc Oxide Seeds by Blending, and Preparation of Zinc-Oxide Nanocomposite 15 ml of DMAc was mixed with 100 mg of sodium dodecyl sulfate (SDS), followed by ultrasonic stirring for 2 hours. 100 mg of zinc oxide nanoparticles were added to the stirred solution to prepare a zinc oxide/DMAc solution. Then, 15 ml of a cellulose solution (cellulose pulp/DMAc weight ratio=1.5 wt %) was added to the zinc oxide/DMAc solution, and the mixture was blended by stirring at 60° C. for 2 hours. The resulting blend was subjected to a casting process to form a cellulose film having zinc oxide seeds produced thereon and/or therein.

Then, the cellulose film having the produced seeds was washed with distilled water to remove unbound zinc oxide particles. The washed cellulose film was added to and reacted with an aqueous solution of 0.03 mole of zinc sulfate and 0.9 mole of ammonium chloride at 60° C. for 6 hours to grow rod-like zinc oxide crystals, thereby forming a zinc oxide layer having a thickness of about 5 μm. The piezoelectric constant and Young's modulus of the zinc oxide-cellulose nanocomposite prepared as described above were measured to be 34 pC/N and 4.0 GPa, respectively.

Examples 3: Production of Zinc Oxide Seeds by Direct Application, and Preparation of Zinc-Oxide Nanocomposite 0.05 mole of zinc acetate was mixed with 400 ml of ethanol, and the mixture was applied to the regenerated wet cellulose film (80×80 mm), prepared in the Preparation Example above, by a drop method using a spoid. The application process was repeated 10 times, and then the cellulose film was maintained at 100° C., thereby producing zinc oxide seeds on the cellulose film. After production of the seeds, the cellulose film was allowed to stand at the same temperature for 1 hour to volatilize the remaining solution. Then, the cellulose film having the seeds formed thereon was washed with distilled water to remove unbound zinc oxide particles. The washed cellulose film was added to and reacted with a solution of 0.05 mole of zinc nitrate and 0.05 mole of hexamethylenetetramine (HMTA) in deionized water at 90° C. for 2 hours to grow rod-like zinc oxide crystals, thereby forming a zinc oxide layer having a thickness of about 0.6 μm. The piezoelectric constant and Young's modulus of the zinc oxide-cellulose nanocomposite prepared as described above were measured to be 420 pC/N and 4.1 GPa, respectively.

The invention claimed is:
1. A method for preparing a cellulose-zinc oxide nanocomposite, the method comprising the steps of:
   mixing an organic solvent with a surfactant at a weight ratio of 1:3-1:10 and adding zinc oxide nanoparticles thereto to prepare a mixed solution;
   adding a cellulose solution to the mixed solution, followed by stirring;
   subjecting the stirred solution to a casting process and a washing process to prepare a cellulose film having zinc oxide seeds produced thereon and/or therein; and
   forming a zinc oxide layer on the cellulose film by growing zinc oxide crystals from the zinc oxide seeds wherein the cellulose film having the zinc oxide seeds is added to an aqueous solution containing zinc source and an amine-group containing compound, followed by stirring the aqueous solution at a temperature of 60-90° C. for 2-10 hours.

* * * * *